US010351955B2

(12) United States Patent
Keshavamurthy et al.

(10) Patent No.: US 10,351,955 B2
(45) Date of Patent: Jul. 16, 2019

(54) SEMICONDUCTOR SUBSTRATE PROCESSING APPARATUS INCLUDING UNIFORMITY BAFFLES

(71) Applicant: Lam Research Corporation, Fremont, CA (US)

(72) Inventors: Arun Keshavamurthy, Bangalore (IN); Bart van Schravendijk, Cupertino, CA (US); David Cohen, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1046 days.

(21) Appl. No.: 14/575,594

(22) Filed: Dec. 18, 2014

(65) Prior Publication Data

US 2015/0167168 A1 Jun. 18, 2015

Related U.S. Application Data

(60) Provisional application No. 61/917,590, filed on Dec. 18, 2013.

(51) Int. Cl.
   *C23C 16/455* (2006.01)
   *C23C 16/505* (2006.01)

(52) U.S. Cl.
   CPC ...... *C23C 16/45565* (2013.01); *C23C 16/455* (2013.01); *C23C 16/45591* (2013.01); *C23C 16/505* (2013.01); *Y10T 29/4943* (2015.01)

(58) Field of Classification Search
   CPC ....... C23C 16/45512; C23C 16/45523–45555; C23C 16/455–4551;
   (Continued)

(56) References Cited

U.S. PATENT DOCUMENTS 4,421,786 A * 12/1983 Mahajan ............... C30B 25/12
                                                           117/101
4,960,488 A * 10/1990 Law ..................... C23C 16/402
                                                           134/1
(Continued)

FOREIGN PATENT DOCUMENTS

WO    WO 2007060143 A1 *  5/2007    ......... C23C 16/4401
WO    WO-2012087002 A2 *  6/2012    ....... C23C 16/45508

OTHER PUBLICATIONS

First Office Action dated May 21, 2018 in corresponding Taiwan Patent Application No. 103144244, 12 pages.

*Primary Examiner* — Jeffrie R Lund
*Assistant Examiner* — Stanislav Antolin
(74) *Attorney, Agent, or Firm* — Buchanan Ingersoll & Rooney PC

(57) ABSTRACT

A semiconductor substrate processing apparatus for processing semiconductor substrates includes showerhead module delivering process gas through a faceplate having gas passages therethrough from the process gas source to a processing zone of the processing apparatus wherein individual semiconductor substrates are processed. The showerhead module comprises a gas delivery conduit in fluid communication with a cavity at a lower end thereof, a baffle arrangement in the gas delivery conduit and the cavity, and a blocker plate in the cavity disposed below the baffle arrangement. The baffle arrangement comprises baffles which divide process gas flowing through the gas delivery conduit into center, inner annular, and outer annular flow streams. The center flow stream exits the baffle arrangement above a central portion of the faceplate, the inner annular flow stream exits the baffle arrangement above an inner (Continued)

annular region of the faceplate, and the outer annular flow stream exits the baffle arrangement above an outer annular region of the faceplate.

20 Claims, 7 Drawing Sheets

(58) Field of Classification Search
CPC ......... C23C 16/45563–4558; C23C 16/45565; C23C 16/45587–45591; C23C 16/45591; C23C 16/505; C23C 16/50–5096; H01J 37/32009–32422; H01J 37/3244–32449; H01L 21/02271–0228; H01L 21/67011; H01L 21/67063–67069; Y10T 29/4943
See application file for complete search history.

(56) References Cited

U.S. PATENT DOCUMENTS

| | | | |
|---|---|---|---|
| 5,027,746 A * | 7/1991 | Frijlink | C30B 25/10 118/715 |
| 5,106,453 A * | 4/1992 | Benko | C23C 16/455 117/104 |
| 5,212,116 A * | 5/1993 | Yu | H01L 21/02164 216/66 |
| 5,453,124 A * | 9/1995 | Moslehi | C23C 16/45561 118/715 |
| 5,614,026 A * | 3/1997 | Williams | C23C 16/4412 118/723 ER |
| 5,643,394 A | 7/1997 | Maydan et al. | |
| 5,741,363 A * | 4/1998 | Van Buskirk | C23C 16/45565 118/715 |
| 5,888,303 A * | 3/1999 | Dixon | C23C 16/455 118/715 |
| 5,950,925 A | 9/1999 | Fukunaga et al. | |
| 6,010,748 A * | 1/2000 | Van Buskirk | C23C 16/455 427/248.1 |
| 6,025,013 A * | 2/2000 | Heming | C23C 16/455 427/162 |
| 6,030,508 A | 2/2000 | Yang et al. | |
| 6,090,211 A * | 7/2000 | Kamei | C23C 16/45574 118/715 |
| 6,132,512 A | 10/2000 | Horie et al. | |
| 6,190,732 B1 * | 2/2001 | Omstead | C23C 16/4408 118/729 |
| 6,274,495 B1 | 8/2001 | Omstead et al. | |
| 6,444,039 B1 * | 9/2002 | Nguyen | C23C 16/455 118/715 |
| 6,478,872 B1 | 11/2002 | Chae et al. | |
| 6,537,420 B2 * | 3/2003 | Rose | C23C 16/45565 118/715 |
| 6,692,575 B1 | 2/2004 | Omstead et al. | |
| 6,830,624 B2 | 12/2004 | Janakiraman et al. | |
| 6,899,764 B2 | 5/2005 | Frijlink | |
| 7,017,514 B1 | 3/2006 | Shepherd, Jr. et al. | |
| 7,431,772 B2 | 10/2008 | Murugesh et al. | |
| 7,572,337 B2 | 8/2009 | Rocha-Alvarez et al. | |
| 7,622,005 B2 | 11/2009 | Balasubramanian et al. | |
| 7,658,800 B2 | 2/2010 | Chen et al. | |
| 7,718,004 B2 | 5/2010 | Satoh et al. | |
| 7,829,145 B2 | 11/2010 | Balasubramanian et al. | |
| 7,892,357 B2 | 2/2011 | Srivastava | |
| 8,137,467 B2 | 3/2012 | Meinhold et al. | |
| 8,152,924 B2 | 4/2012 | Dauelsberg et al. | |
| 8,268,181 B2 | 9/2012 | Srivastava et al. | |
| 8,431,033 B2 | 4/2013 | Zhou et al. | |
| 8,557,712 B1 | 10/2013 | Antonelli et al. | |
| 8,580,697 B1 | 11/2013 | Lang et al. | |
| 8,846,536 B2 | 9/2014 | Draeger et al. | |
| 8,883,637 B2 | 11/2014 | Jeng et al. | |
| 2002/0001953 A1 * | 1/2002 | Heuken | C30B 25/10 438/689 |
| 2003/0019428 A1 * | 1/2003 | Ku | C23C 16/455 118/715 |
| 2003/0041801 A1 * | 3/2003 | Hehmann | C23C 14/14 118/715 |
| 2003/0118878 A1 * | 6/2003 | Pinto | F15D 1/04 137/14 |
| 2004/0050325 A1 * | 3/2004 | Samoilov | C23C 16/45561 118/715 |
| 2004/0050326 A1 * | 3/2004 | Thilderkvist | C23C 16/45561 118/715 |
| 2004/0129212 A1 * | 7/2004 | Gadgil | C23C 16/452 118/715 |
| 2004/0200412 A1 * | 10/2004 | Frijlink | C23C 16/4412 118/715 |
| 2005/0081788 A1 | 4/2005 | Jurgensen et al. | |
| 2006/0086319 A1 | 4/2006 | Kasai et al. | |
| 2007/0215048 A1 * | 9/2007 | Suzuki | C23C 16/16 118/725 |
| 2007/0235137 A1 * | 10/2007 | Tsukamoto | H01L 21/6875 156/345.35 |
| 2007/0277734 A1 | 12/2007 | Lubomirsky et al. | |
| 2008/0006208 A1 * | 1/2008 | Ueno | C23C 16/303 118/730 |
| 2008/0017099 A1 * | 1/2008 | Onomura | C23C 16/45572 117/89 |
| 2008/0185104 A1 * | 8/2008 | Brcka | H01J 37/32357 156/345.29 |
| 2009/0095218 A1 | 4/2009 | Meinhold et al. | |
| 2009/0218000 A1 * | 9/2009 | Pfau | F15D 1/04 138/39 |
| 2009/0260571 A1 * | 10/2009 | Ostrowski | C23C 16/45565 118/728 |
| 2010/0199914 A1 * | 8/2010 | Iza | C23C 16/45508 118/725 |
| 2010/0263588 A1 * | 10/2010 | Zhiyin | C23C 16/45508 117/98 |
| 2010/0307418 A1 * | 12/2010 | Iso | C23C 16/301 118/725 |
| 2011/0098841 A1 * | 4/2011 | Tsuda | H01L 21/6875 156/345.35 |
| 2012/0160170 A1 * | 6/2012 | Yamaguchi | C23C 16/45508 118/725 |
| 2012/0174866 A1 * | 7/2012 | Huh | C23C 16/45559 118/725 |
| 2012/0222815 A1 | 9/2012 | Sabri et al. | |
| 2013/0092086 A1 | 4/2013 | Keil et al. | |
| 2013/0149866 A1 | 6/2013 | Shriner | |
| 2013/0260488 A1 * | 10/2013 | Kim | H01J 37/32357 156/345.29 |
| 2013/0316094 A1 * | 11/2013 | Leeser | C23C 16/452 118/715 |
| 2013/0319329 A1 | 12/2013 | Li et al. | |
| 2014/0338771 A1 * | 11/2014 | Brown | C23C 16/45559 118/725 |

* cited by examiner

SEMICONDUCTOR SUBSTRATE PROCESSING APPARATUS INCLUDING UNIFORMITY BAFFLES

CROSS-REFERENCE TO RELATED APPLICATIONS

This application claims priority under 35 U.S.C. § 119(e) to U.S. provisional Application No. 61/917,590 filed Dec. 18, 2013, the disclosure of which is hereby incorporated herein by reference.

FIELD OF THE INVENTION

This invention pertains to semiconductor substrate processing apparatuses used for performing processing semiconductor substrates, and may find particular use in performing chemical vapor depositions of thin films.

BACKGROUND

Semiconductor substrate processing apparatuses are used to process semiconductor substrates by techniques including, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, etching, and resist removal. One type of semiconductor substrate processing apparatus used to process semiconductor substrates includes a reaction chamber containing a showerhead module and a substrate pedestal module which supports the semiconductor substrate in the reaction chamber. The showerhead module delivers process gas into the reactor chamber so that the semiconductor substrate may be processed. In such chambers nonuniform process gas flow delivery across an upper surface of a semiconductor substrate can lead to nonuniform film deposition during substrate processing.

SUMMARY

Disclosed herein is a semiconductor substrate processing apparatus for processing semiconductor substrates. The semiconductor substrate processing apparatus preferably comprises a chemical isolation chamber in which semiconductor substrates are processed. A process gas source is in fluid communication with the chemical isolation chamber for supplying a process gas into the chemical isolation chamber. A showerhead module delivers process gas through a faceplate having gas passages therethrough from the process gas source to a processing zone of the semiconductor substrate processing apparatus wherein individual semiconductor substrates are processed. The showerhead module comprises a gas delivery conduit in fluid communication with a cavity at a lower end thereof, a baffle arrangement in the gas delivery conduit and the cavity, and a blocker plate in the cavity disposed below the baffle arrangement. The baffle arrangement comprises baffles which divide process gas flowing through the gas delivery conduit into center, inner annular, and outer annular flow streams. The center flow stream exits the baffle arrangement after being deflected by the blocker plate and directed radially outward above a central portion of the faceplate, the inner annular flow stream exits the baffle arrangement above an inner annular region of the faceplate, and the outer annular flow stream exits the baffle arrangement above an outer annular region of the faceplate. A substrate pedestal module is adjacent the faceplate of the showerhead module wherein the substrate pedestal module is configured to support the semiconductor substrate in the processing zone below the faceplate during processing of the substrate.

Also disclosed herein is a showerhead module of a semiconductor substrate processing apparatus which delivers process gas through a faceplate having gas passages therethrough from a process gas source to a processing zone of the semiconductor substrate processing apparatus wherein individual semiconductor substrates are processed. The showerhead module comprises a gas delivery conduit in fluid communication with a cavity at a lower end thereof, a baffle arrangement in the gas delivery conduit and the cavity, and a blocker plate in the cavity disposed below the baffle arrangement. The baffle arrangement comprises baffles which divide process gas flowing through the gas delivery conduit into center, inner annular, and outer annular flow streams, the center flow stream exiting the baffle arrangement after being deflected by the blocker plate and directed radially outward above a central portion of the faceplate, the inner annular flow stream exiting the baffle arrangement above an inner annular region of the faceplate, and the outer annular flow stream exiting the baffle arrangement above an outer annular region of the faceplate.

BRIEF DESCRIPTION OF THE DRAWING FIGURES

DETAILED DESCRIPTION

Figure 1:
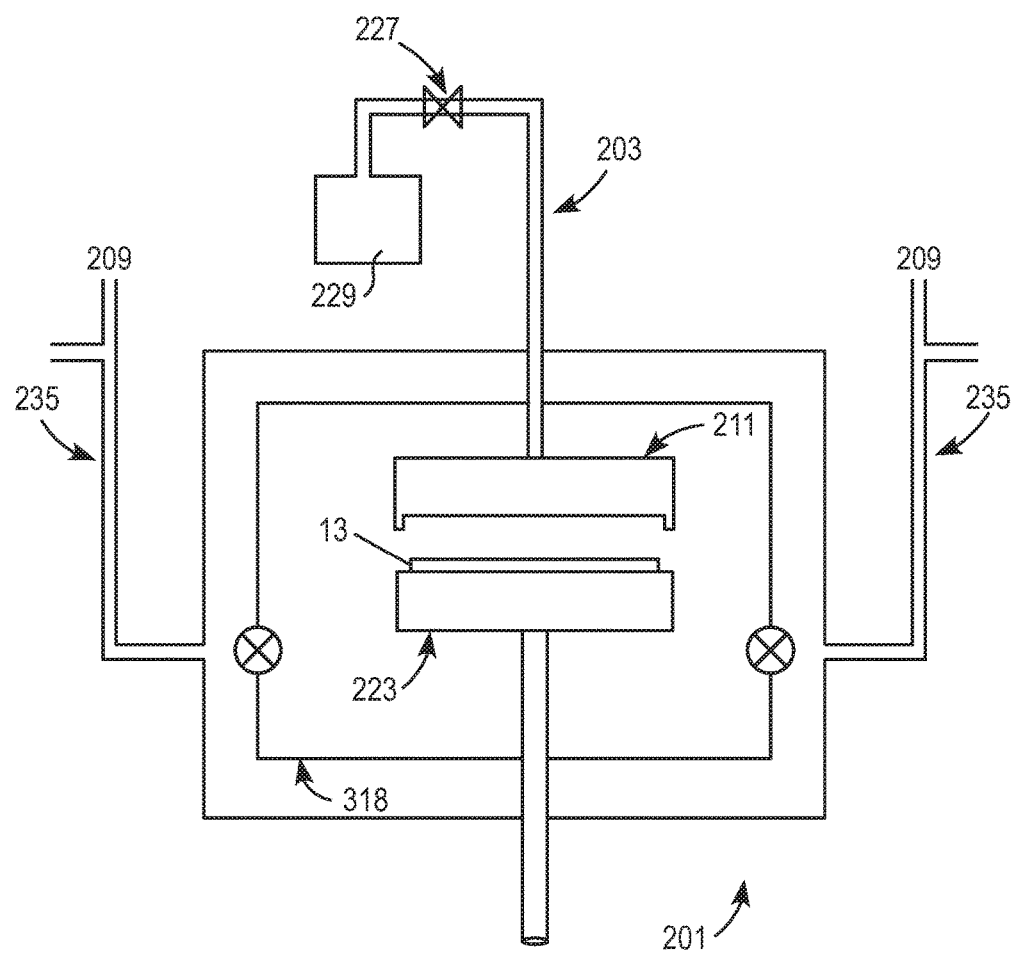
FIG. 1 illustrates a schematic diagram showing an overview of a chemical deposition apparatus in accordance with embodiments disclosed herein.

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein in connection with numerical values the term "about" refers to ±10%.

Disclosed herein is a semiconductor substrate processing apparatus such as a chemical vapor deposition apparatus for processing semiconductor substrates. The processing apparatus preferably comprises a chemical isolation chamber in which semiconductor substrates are processed. A process gas source is in fluid communication with the chemical isolation chamber for supplying a process gas into the chemical isolation chamber. A showerhead module delivers process gas through a faceplate having gas passages therethrough from the process gas source to a processing zone of the processing apparatus wherein individual semiconductor substrates are processed. The showerhead module comprises a gas delivery conduit in fluid communication with a cavity at a lower end thereof, a baffle arrangement in the gas delivery conduit and the cavity, and a blocker plate in the cavity disposed below the baffle arrangement. The baffle arrangement comprises baffles which divide process gas flowing through the gas delivery conduit into center, inner annular, and outer annular flow streams. The center flow stream exits the baffle arrangement after being deflected by the blocker plate and directed radially outward above a central portion of the faceplate, the inner annular flow stream exits the baffle arrangement above an inner annular region of the faceplate, and the outer annular flow stream exits the baffle arrangement above an outer annular region of the faceplate. A substrate pedestal module is adjacent the faceplate of the showerhead module wherein the substrate pedestal module is configured to support the semiconductor substrate in the processing zone below the faceplate during processing of the substrate.

In an embodiment, the baffle arrangement comprises a first baffle which includes a vertically extending inner tube in the gas delivery conduit and a lower annular disc extending horizontally outward from a lower end of the inner tube in the cavity, and a second baffle which includes a vertically extending outer tube in the gas delivery conduit and an upper annular disc extending horizontally outward from a lower end of the outer tube in the cavity wherein an outer diameter of the upper annular disc is greater than an outer diameter of the lower annular disc. A diameter of the inner tube in fluid communication with a first gap between the blocker plate and the lower annular disc, a second gap between the inner tube and the outer tube in fluid communication with a third gap between the lower annular disc and the upper annular disc, and a fourth gap between the outer tube and inner wall of the gas delivery conduit in fluid communication with a fifth gap between the upper annular disc and an upper wall of the cavity can each provide different flow rates of process gas into the cavity at different radial locations thereof such that a uniform concentration of process gas is delivered through the faceplate, that forms a lower wall of the cavity, to a processing zone above an upper surface of a semiconductor substrate.

As indicated, present embodiments provide semiconductor substrate processing apparatuses such as deposition apparatuses (or in an alternate embodiment an etching apparatus) and associated methods for conducting a chemical vapor deposition such as a plasma enhanced chemical vapor deposition. The apparatus and methods are particularly applicable for use in conjunction with semiconductor fabrication based dielectric deposition processes or metal deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), molecular layer deposition (MLD), or plasma enhanced pulsed deposition layer (PEPDL) processing), however they are not so limited. Exemplary embodiments of methods of processing a semiconductor substrate can be found in commonly-assigned U.S. Patent Application Nos. 2013/0230987, 2013/0005140, 2013/0319329, and U.S. Pat. Nos. 8,580,697, 8,431,033, and 8,557,712, which are hereby incorporated by reference in their entirety.

The aforementioned processes can suffer from some drawbacks associated with nonuniform process gas delivery to an upper surface of a wafer or semiconductor substrate receiving deposited process gas such as a process gas precursor or reactant. For example, a nonuniform precursor distribution on the upper surface of the substrate can form after a pulse of the precursor wherein more precursor gas is delivered to the center of the substrate than the edge of the substrate. A nonuniform precursor distribution can also form during a transient process gas flow period which occurs during a pulse of the precursor wherein the flow rate of the precursor is varied (i.e. a change in the rate of flow of process gas delivered through the showerhead module to the processing zone). For example, a transient gas flow period exists between the time the process gas flow is first initiated until the time when the process gas flow reaches a steady state (i.e. a steady rate) of gas flow, or a transient gas flow period exists during the time when a process gas flow rate is increased or decreased. Further, in ALD processes wherein the precursor flows upon the upper surface of the substrate for a length of time required to reach saturation across the entire upper surface of the substrate, the length of time required to reach saturation will be dictated by the uniformity of the precursor delivered to the upper surface. Thus, the time to reach saturation, and thereby the throughput of the apparatus, is dictated by the uniformity of the delivered precursor. Further, the uniformity of process gas delivered to the substrate, as well as the throughput of the apparatus is dependent upon the time required for the process gas flow to reach a steady state of gas flow, as shorter times required to reach a steady state of gas flow reduce transient gas flow periods wherein process gas is not delivered uniformly to the substrate. Therefore, the showerhead which forms an upper wall of a processing zone of the apparatus preferably delivers process gas uniformly to the upper surface of the substrate to achieve uniform coatings on the surface of the substrate, shorter process gas flow times, and shorter times required to reach a steady state of gas flow through the showerhead (i.e. reduced transient process gas flow period), and reduced costs by reducing the amount of process gas used for a given process.

There are generally two main types of deposition showerheads: the chandelier type and the flush mount type. The chandelier showerheads have a stem attached to the top of the chamber on one end and the faceplate on the other end, resembling a chandelier. A part of the stem may protrude the chamber top to enable connection of gas lines and RF power. Flush mount showerheads are integrated into the top of a chamber and have a stem which is located outside of the top of the chamber. Present embodiments disclosed herein pertain to a chandelier type showerhead or a flush mount showerhead.

FIG. 1 is a schematic diagram showing an overview of a chemical deposition apparatus 201 in accordance with embodiments disclosed herein. A substrate 13 sits on top of a movable pedestal module 223 that can be raised or lowered relative to a showerhead module 211, which may also be moved vertically. Reactant material gases are introduced into a processing zone 318 of the chamber via gas line 203 wherein the process gas flow is controlled by a mass flow controller 229. Note that the apparatus may be modified to have one or more gas lines, depending on the number of reactant gases used. The chamber is evacuated through vacuum lines 235 that are connected to a vacuum source 209. The vacuum source may be a vacuum pump.

Figure 2:
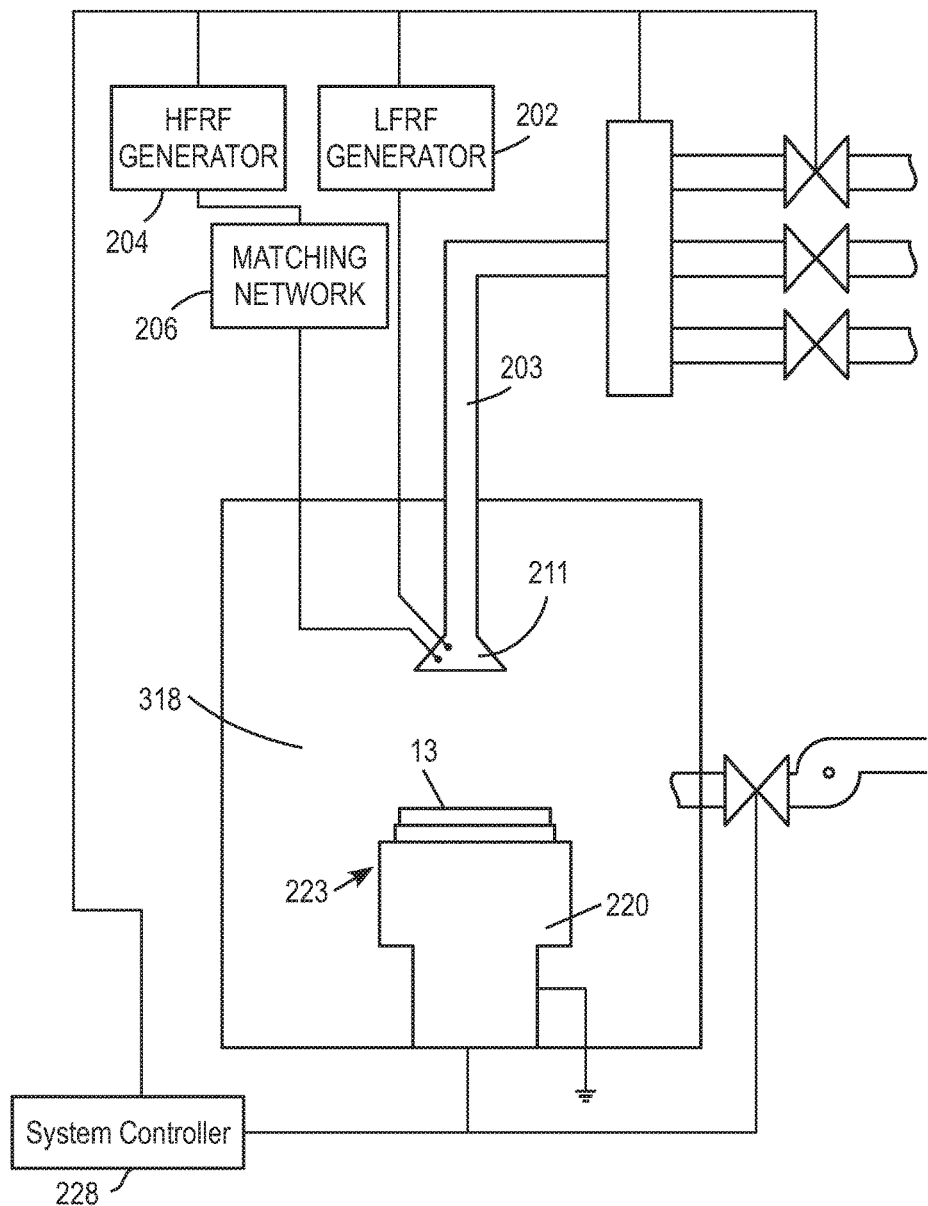
FIG. 2 illustrates a block diagram depicting various apparatus components arranged for implementing embodiments disclosed herein wherein plasma can be utilized to enhance deposition and/or surface reactions between reacting species during the generation of thin films.

Embodiments disclosed herein are frequently implemented in a plasma enhanced chemical deposition apparatus (i.e. PECVD apparatus, PEALD apparatus, or PEPDL apparatus). FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a pedestal module 223, wherein the pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the pedestal module 223. The power and frequency supplied by matching network 206 is sufficient to generate a plasma from the process gas/vapor. In an embodiment both the HF generator and the LF generator are used, and in an alternate embodiment, just the HF generator is used. In a typical process, the HF generator is operated generally at frequencies of about 2-100 MHz; in a preferred embodiment at 13.56 MHz or 27 MHz. The LF generator is operated generally at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

Within the chamber, the pedestal module 223 supports a substrate 13 on which materials such as thin films may be deposited. The pedestal module 223 can include a fork or lift pins to hold and transfer the substrate during and between the deposition and/or plasma treatment reactions. In an embodiment, the substrate 13 may be configured to rest on a surface of the pedestal module 223, however in alternate embodiments the pedestal module 223 may include an electrostatic chuck, a mechanical chuck, or a vacuum chuck for holding the substrate 13 on the surface of the pedestal module 223. The pedestal module 223 can be coupled with a heater block 220 for heating substrate 13 to a desired temperature. Generally, substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

In certain embodiments, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

According to embodiments disclosed herein, the showerhead module preferably includes a baffle arrangement which reduces transient gas flow periods and increases uniformity of process gas delivered to a substrate supported below the showerhead module. The baffle arrangement comprises baffles which divide process gas flowing through the gas delivery conduit into center, inner annular, and outer annular flow streams, the center flow stream exiting the baffles and directed radially outward above a central portion of the faceplate, the inner annular flow stream exiting the baffles above an inner annular region of the faceplate, and the outer annular flow stream exiting the baffles above an outer annular region of the faceplate. In an embodiment, the baffle arrangement preferably comprises a first baffle which includes a vertically extending inner tube in the gas delivery conduit and a lower annular disc extending horizontally outward from a lower end of the inner tube in the cavity, and a second baffle which includes a vertically extending outer tube in the gas delivery conduit and an upper annular disc extending horizontally outward from a lower end of the outer tube in the cavity wherein an outer diameter of the upper annular disc is greater than an outer diameter of the lower annular disc. Preferably, a diameter of the inner tube in fluid communication with a first gap between the blocker plate and the lower annular disc, a second gap between the inner tube and the outer tube in fluid communication with a third gap between the lower annular disc and the upper annular disc, and a fourth gap between the outer tube and a wall of the gas delivery conduit in fluid communication with a fifth gap between the upper annular disc and an upper wall of the cavity provide different flow rates of process gas into the cavity at different radial locations thereof such that a uniform concentration of process gas is delivered through the faceplate, that forms a lower wall of the cavity, to a processing zone above an upper surface of a semiconductor substrate, wherein the time required for the different flow rates of process gas to each reach a steady state at each of the different radial locations thereof is reduced.

Figure 3:
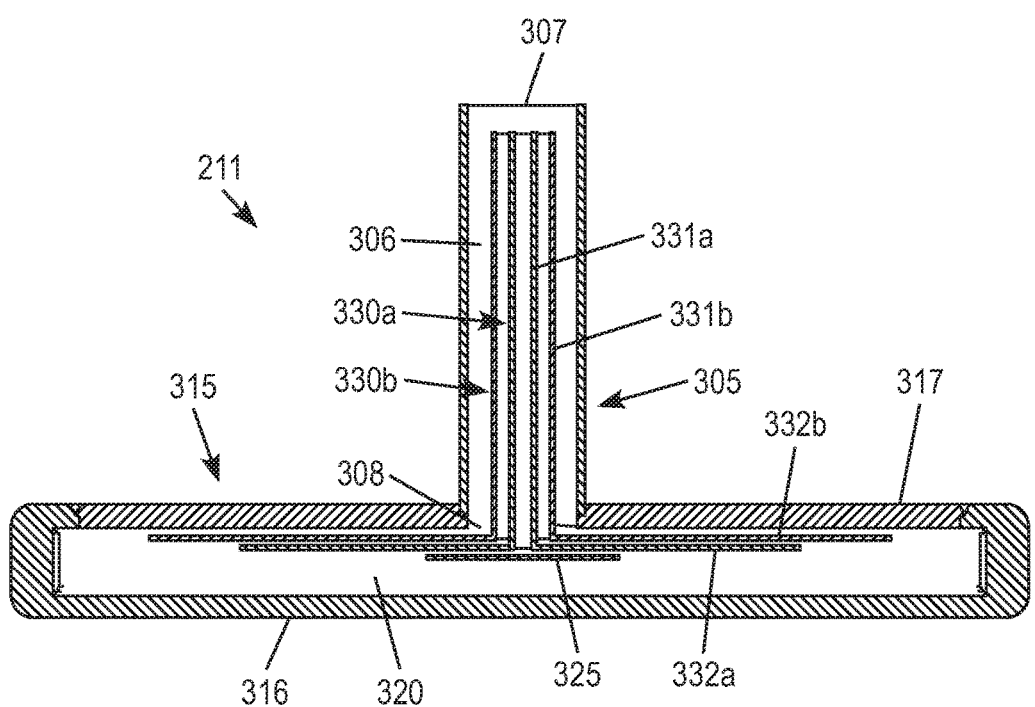
FIG. 3 illustrates a showerhead module arranged in accordance with embodiments disclosed herein.
Figure 4:
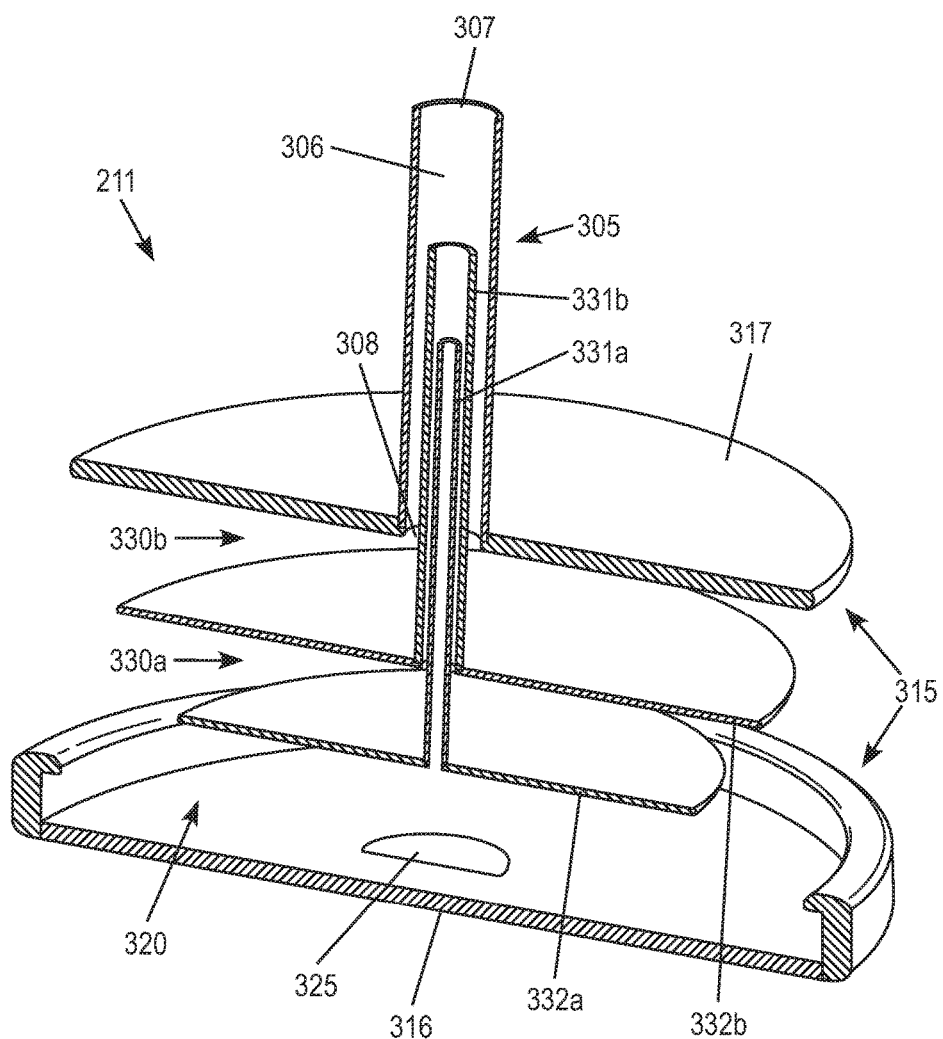
FIG. 4 illustrates a cross section of a showerhead module arranged in accordance with embodiments disclosed herein.

For example, FIGS. 3 and 4 illustrate cross sections of the showerhead module 211 which can be included in the apparatus FIGS. 1 and/or 2 wherein the showerhead module 211 includes a baffle arrangement according to embodiments disclosed herein and wherein FIG. 4 shows an exploded diagram of the showerhead module illustrated in FIG. 3. The showerhead module 211 is operable to deliver process gas to an upper surface of a substrate to be processed with reduced transient gas flow time periods. The showerhead module 211 is preferably temperature controlled and RF powered. An exemplary embodiment of a temperature controlled RF powered showerhead module can be found in commonly-assigned U.S. Patent Application No. 2013/0316094 which is hereby incorporated by reference in its entirety. The showerhead module 211 is preferably supported by a top wall of the plasma processing apparatus. An exemplary embodiment of a showerhead module support can be found in commonly-assigned U.S. Patent Application No. 2009/0260571 which is hereby incorporated by reference in its entirety.

The showerhead module 211 preferably includes a stem 305 connected to a base 315. The base includes a faceplate 316 having gas passages therethrough which forms a lower wall of a cavity 320 disposed therein, and a backing plate 317 which forms an upper wall of the cavity 320. The stem 305 defines a gas delivery conduit 306 which has an inlet 307 and an outlet 308 wherein process gas delivered into the inlet 307 enters the cavity 320 through the outlet 308. A blocker plate 325 is disposed within the cavity 320 which disperses a center stream (see center stream 410 of FIG. 5) of the process gas delivered into the cavity 320. The baffle arrangement of the showerhead module 211 includes a first annular baffle 330a and a second annular baffle 330b disposed above the blocker plate 325. The first annular baffle 330a includes a vertically extending inner tube 331a in the gas delivery conduit 306 and a lower annular disc 332a extending horizontally outward from a lower end of the inner tube 331a in the cavity 320, and the second annular baffle 330b includes a vertically extending outer tube 331b in the gas delivery conduit 306 and a lower annular disc 332b extending horizontally outward from a lower end of the outer tube 331b in the cavity 320. Preferably, the first annular baffle 330a, the second annular baffle 330b, and the gas delivery conduit 306 are coaxial with each other wherein the inner tube 331a of the first annular baffle 330a fits inside of the outer tube 331b of the second annular baffle 330b. Preferably the lower annular disc 332a of the first annular baffle 330a is disposed below the upper annular disc 332b of the second annular baffle 330b wherein the annular discs 332a, 332b are parallel to a lower surface of the faceplate 316. In alternate embodiments, more than two annular baffles can be included in the showerhead module 211. As shown in FIG. 3, the faceplate 316 forms a lower wall of the cavity 320 and the process gas streams passing through the baffles are recombined above the faceplate 316.

In an embodiment, the baffle arrangement can comprise a plurality of concentric and impervious baffles including an inner baffle, one or more intermediate baffles, and an outer baffle. Each baffle divides process gas delivered into the gas delivery conduit into inner and outer flow streams such that the plurality of concentric baffles divide process gas flowing through the conduit into the center flow stream, at least two inner annular flow streams, and the outer annular flow stream. The center flow stream exits the baffles and is directed radially outward above the central portion of the faceplate, the inner annular flow streams exit the baffles at different radial locations above the inner annular region of the faceplate, and the outer annular flow stream exits the baffles above the outer annular region of the faceplate. As shown in FIG. 3, the baffles divide the process gas flowing through the gas delivery conduit 306 into predetermined ratios forming center, inner annular, and outer annular flow streams which flow into and are recombined in an open region of the cavity above the faceplate 316.

Figure 5:
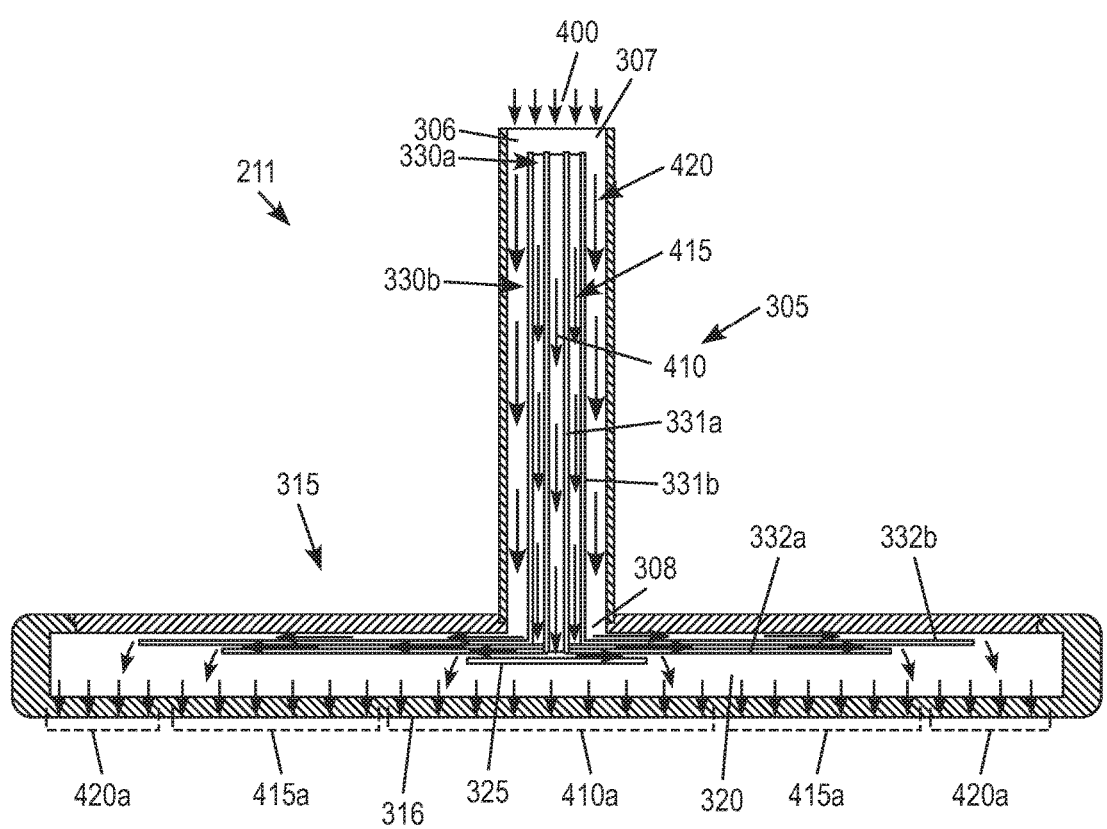
FIG. 5 illustrates a cross section of a showerhead module arranged in accordance with embodiments disclosed herein.

FIG. 5 shows a model of process gas flowing through the showerhead module 211 of FIG. 3. As illustrated, the showerhead module 211 includes the first annular baffle 330a and the second annular baffle 330b. Process gas 400 is delivered into the inlet 307 of the stem 305 wherein the inner tube 331a of the first annular baffle 330a divides the process gas 400 into a center stream 410 and a first annular stream 415 and the outer tube 331b of the second annular baffle 330b divides the process gas into the first annular stream 415 and a second annular stream 420. The center stream 410 travels through the inner tube 331a of the first annular baffle 330a until it is dispersed radially outward by the blocker plate 325 wherein the inner tube 331a is in fluid communication with a first gap between the blocker plate 325 and the lower annular disc 332a. The first annular stream 415 travels between the inner tube 331a of the first annular baffle 330a and the outer tube 331b of the second annular baffle 330b until it is dispersed by the lower annular disc 332a of the first annular baffle 330a wherein a second gap between the inner tube 331a and the outer tube 331b is in fluid communication with a third gap between the lower annular disc 332a and the upper annular disc 332b. The second annular stream 420 travels between the outer tube 331b of the second annular baffle 330b and the inner wall of the stem 305 forming the gas delivery conduit 306 until it is dispersed by the upper annular disc 332b of the second annular baffle 330b wherein a fourth gap between the outer tube 331b and the wall is in fluid communication with a fifth gap between the upper annular disc 332b an upper wall of the cavity 320. In this manner, the flow rates of the center stream 410, the first annular stream 415 (i.e. inner annular stream), and the second annular stream 420 (i.e. outer annular stream) can be controlled such that the center stream 410, the first annular stream 415, and the second annular stream 420 can all be supplied to a different radial locations of the faceplate 316 so as to provide a uniform concentration of process gas delivered through the faceplate 316 to a processing zone above an upper surface of a semiconductor substrate. For example, as illustrated, the center stream 410 is delivered to a central region 410a of the faceplate 316, and is thereby delivered through the central region 410a of the faceplate 316 to a central region of the substrate supported therebelow. The first annular stream 415 is delivered to an intermediate region 415a of the faceplate 316, and is thereby delivered through the intermediate region 415a of the faceplate 316 to an intermediate region of the substrate supported therebelow, and the second annular stream 420 is delivered to an outer region 420a of the faceplate, and is thereby delivered through the outer region 420a of the faceplate 316 to an outer region of the substrate supported therebelow. Thus, the baffle arrangement provides flow rates such that the center flow stream reaches an upper surface of the faceplate at the same time as the inner and outer annular flow streams.

The diameters of each of the respective inner and outer tubes 331a, 331b and the respective lower and upper annular discs 332a, 332b of the respective annular baffles 330a, 330b are selected such that the annular baffles 330a, 330b divide the flow of the process gas into predetermined ratios for the center stream 410, the inner annular stream 415, and the outer annular stream 420. Thus, the center stream 410 of the process gas flow 400 entering the central region 410a reaches the center region of the substrate at the same time as the flow of the inner annular stream 415 reaches an intermediate region of the substrate, and at the same time as the flow of the outer annular stream 420 reaches the outer region of the substrate thereby providing uniform process gas flow to the upper surface of the substrate. Preferably, the diameters of each the lower and upper annular discs 332a, 332b of each respective annular baffle 330a, 330b is between about 0.3 times to about 0.95 times the diameter of the faceplate 317. Further, by controlling (i.e. optimizing) the diameters of the of each of the respective inner and outer tube 331a, 331b and lower and upper annular discs 332a, 332b of the respective annular baffles 330a, 330b, as well as the gap spacing therebetween (e.g. the first through fifth gaps), a single mass flow controller can be used to deliver the process gas to the processing zone above the substrate.

Figure 6:
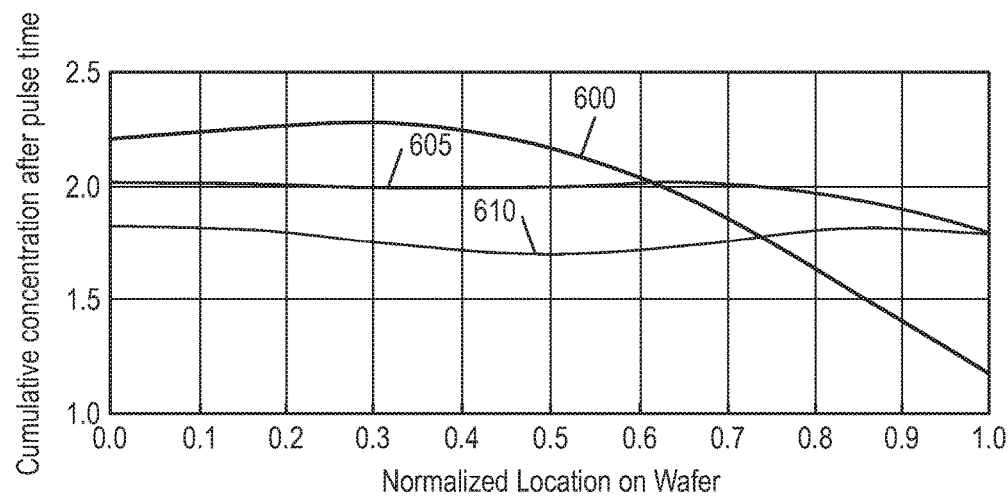
FIG. 6 illustrates a graph of precursor concentration on the upper surface of a substrate for embodiments of showerhead modules in accordance with embodiments disclosed herein.
Figure 7:
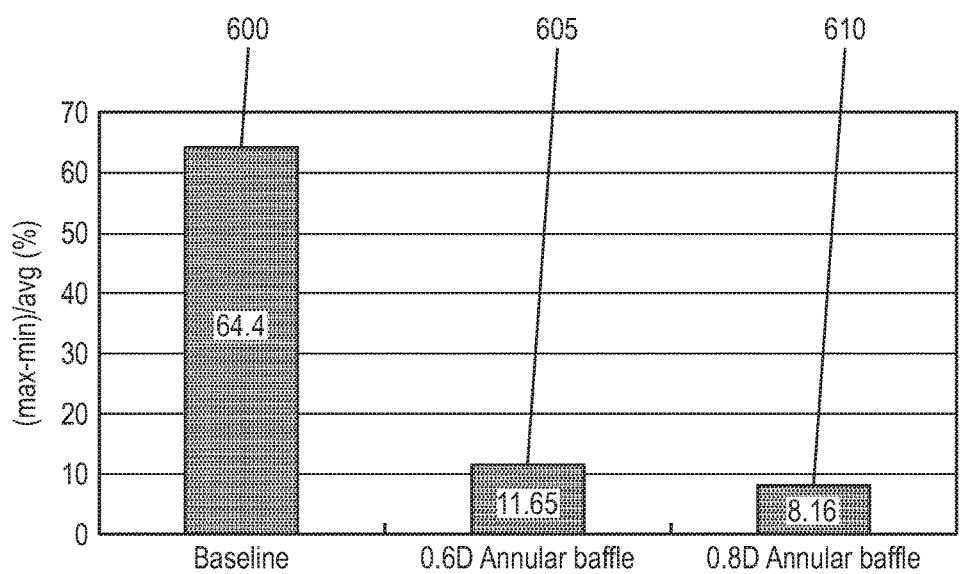
FIG. 7 illustrates a graph of nonuniformity for embodiments of showerhead modules in accordance with embodiments disclosed herein.

FIG. 6 shows a graph of cumulative precursor concentration on the upper surface of a substrate after a given pulse time for a first showerhead module 600 which does not include a baffle arrangement, a second showerhead module 605 which includes a single annular baffle which has an annular disc diameter of 0.6 times the diameter of the faceplate, and a third showerhead module 610 which includes a single annular baffle which has an annular disc diameter of 0.8 times the diameter of the faceplate. As shown, the precursor concentration for the first showerhead 600 which does not include an annular baffle has a high precursor concentration at the center region of the substrate and a low precursor concentration at the edge of the substrate whereas when the annular baffles are used for the second and third annular baffles 605, 610 respectively, the center to edge variation of precursor concentration across the upper surface of the substrate decreases. FIG. 7 shows percent nonuniformity of precursor concentration across the upper surface of a substrate for the first showerhead module 600 which does not include a baffle arrangement, the second showerhead module 605 which includes the annular baffle which has an annular disc diameter of 0.6 times the diameter of the faceplate, and the third showerhead module 610 which includes the annular baffle which has an annular disc diameter of 0.8 times the diameter of the faceplate. The center to edge variation for second showerhead module 605 including the baffle having the annular disc with a diameter of about 0.6 times the faceplate has a variation of about 11%, and the center to edge variation for the third showerhead module 610 including the baffle having the annular disc with a diameter of about 0.8 times the faceplate has a concentration variation of about 8% whereas the first showerhead module 600 which does not include the annular baffle has a concentration variation of about 64%. Thus, the precursor uniformity can be increased by as much as 8 times with optimized annular baffles.

Figure 8:
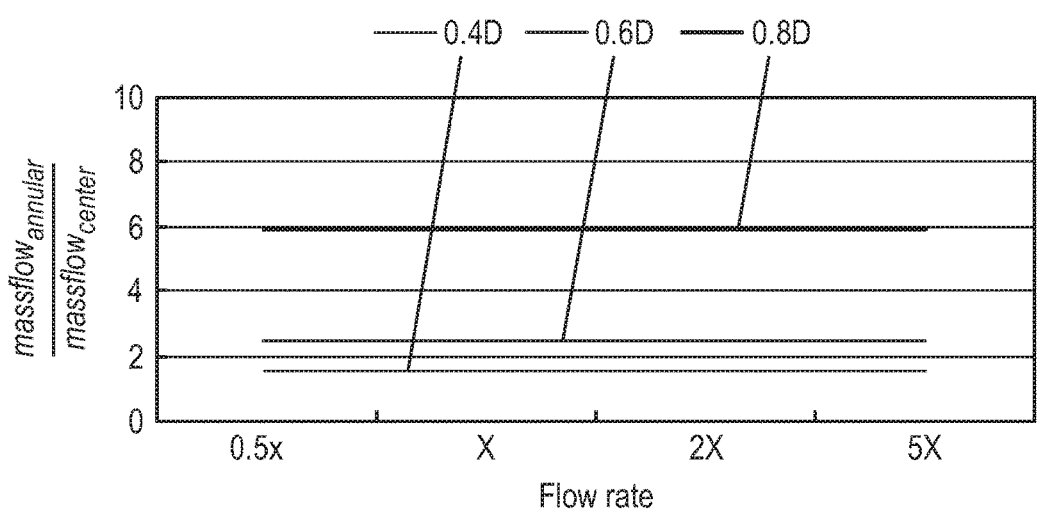
FIG. 8 illustrates a graph of process gas flow rates for embodiments of showerhead modules in accordance with embodiments disclosed herein.

FIG. 8 illustrates a graph of the sensitivity of flow division by annular baffles for different tested flow rates. As shown, a flow rate which is varied from 0.5 time to 5 times the flow rate of a baseline flow rate remains constant for annular baffles which have annular discs having diameters of 0.4 times the diameter of the faceplate, 0.6 times the diameter of the faceplate, and 0.8 times the diameter of the faceplate. Thus, a single mass flow controller can be used to deliver process gas to each region of the substrate.

While the semiconductor substrate processing apparatus including the baffle arrangement has been described in detail with reference to specific embodiments thereof, it will be apparent to those skilled in the art that various changes and modifications can be made, and equivalents employed, without departing from the scope of the appended claims.

What is claimed is:

1. A semiconductor substrate processing apparatus for chemical vapor deposition processing semiconductor substrates comprising:
    a chemical isolation chamber in which semiconductor substrates are processed;
    a process gas source in fluid communication with the chemical isolation chamber for supplying a process gas into the chemical isolation chamber;
    a showerhead module which delivers the process gas through a faceplate having gas passages therethrough to a processing zone of the processing apparatus wherein an individual semiconductor substrate is processed, the showerhead module comprising a gas delivery conduit in fluid communication with a cavity at a lower end thereof wherein the faceplate forms a lower wall of the cavity, a baffle arrangement in the gas delivery conduit and the cavity, and a blocker plate in the cavity disposed below the baffle arrangement wherein the baffle arrangement comprises:
    baffles which divide the process gas flowing through the gas delivery conduit into predetermined ratios forming center, inner annular, and outer annular flow streams which flow into the cavity and are recombined above the faceplate, the center flow stream exiting the baffle arrangement into the cavity after being deflected by the blocker plate and directed radially outward above a central portion of the faceplate, the inner annular flow stream exiting the baffle arrangement into the cavity above an inner annular region of the faceplate, and the outer annular flow stream exiting the baffle arrangement into the cavity above an outer annular region of the faceplate; and
    a substrate pedestal module adjacent the faceplate of the showerhead module which is configured to support the substrate in the processing zone below the faceplate during processing of the substrate;
    wherein the baffles provide different flow rates of the center, inner annular, and outer annular flow streams into the cavity at different radial locations such that a uniform concentration of the process gas is delivered through the faceplate.

2. The semiconductor substrate processing apparatus of claim 1, wherein the baffle arrangement comprises:
    a first baffle which includes a vertically extending inner tube in the gas delivery conduit and a lower annular disc extending horizontally outward from a lower end of the inner tube in the cavity; and
    a second baffle which includes a vertically extending outer tube in the gas delivery conduit and an upper annular disc extending horizontally outward from a lower end of the outer tube in the cavity wherein an outer diameter of the upper annular disc is greater than an outer diameter of the lower annular disc;
    wherein the inner tube is in fluid communication with a first gap between the blocker plate and the lower annular disc, a second gap between the inner tube and the outer tube is in fluid communication with a third gap between the lower annular disc and the upper annular disc, and a fourth gap between the outer tube and a wall of the gas delivery conduit is in fluid communication with a fifth gap between the upper annular disc and an upper wall of the cavity, the gaps dimensioned to provide different flow rates of process gas into the cavity at different radial locations thereof such that a uniform concentration of process gas is delivered through the faceplate.

3. The semiconductor substrate processing apparatus of claim 2, wherein the outer diameter of the upper annular disc and the outer diameter of the lower annular disc are about 0.3 to 0.95 times an outer diameter of the faceplate.

4. The semiconductor substrate processing apparatus of claim 2, wherein:
(a) the upper annular disc and the lower annular disc are parallel to the faceplate; and/or
(b) the outer tube and the inner tube are coaxial with the gas delivery conduit.

5. The semiconductor substrate processing apparatus of claim 1, wherein the semiconductor substrate processing apparatus includes:
(a) an RF energy source adapted to energize the process gas into a plasma state in the processing zone;
(b) a control system configured to control processes performed by the processing apparatus;
(c) a non-transitory computer machine-readable medium comprising program instructions for control of the processing apparatus; and/or
(d) a vacuum source in fluid communication with the processing zone for evacuating process gas from the processing zone.

6. The semiconductor substrate processing apparatus of claim 1, wherein a backing plate forms the upper wall of the cavity.

7. The semiconductor substrate processing apparatus of claim 1, further comprising a single mass flow controller which is operable to control the flow rate of the process gas entering the gas delivery conduit; and
the baffle arrangement provides flow rates such that the center flow stream reaches an upper surface of the faceplate at the same time as the inner and outer annular flow streams.

8. The semiconductor substrate processing apparatus of claim 1, wherein the gas delivery conduit forms a stem of the showerhead module and the cavity is disposed in a base of the showerhead module wherein the stem is connected to the base.

9. The semiconductor substrate processing apparatus of claim 1, wherein the baffle arrangement comprises a plurality of concentric baffles including an inner baffle, one or more intermediate baffles, and an outer baffle wherein each baffle divides process gas delivered into the gas delivery conduit into inner and outer flow streams such that the plurality of concentric baffles divide process gas flowing through the conduit into the center flow stream, at least two inner annular flow streams, and the outer annular flow stream, the center flow stream exiting the baffles and directed radially outward above the central portion of the faceplate, the inner annular flow streams exiting the baffles at different radial locations above the inner annular region of the faceplate, and the outer annular flow stream exiting the baffles above the outer annular region of the faceplate.

10. A method of processing a semiconductor substrate in the semiductor substrate processing apparatus according to claim 1, comprising:
supplying the process gas from the process gas source into the processing zone; and processing a semiconductor substrate in the processing zone;
wherein the processing is at least one of chemical vapor deposition; plasma-enhanced chemical vapor deposition; atomic layer deposition; plasma-enhanced atomic layer deposition; pulsed deposition layer; molecular layer deposition; etching; resist removal; and/or plasma enhanced pulsed deposition layer.

11. A showerhead module of a semiconductor substrate processing apparatus which delivers process gas through a faceplate having gas passages therethrough from a process gas source to a processing zone of the processing apparatus wherein a semiconductor substrate is processed comprises:
a gas delivery conduit in fluid communication with a cavity at a lower end thereof wherein the faceplate forms a lower wall of the cavity;
a baffle arrangement in the gas delivery conduit and the cavity; and
a blocker plate in the cavity disposed below the baffle arrangement;
wherein the baffle arrangement comprises:
baffles which divide the process gas flowing through the gas delivery conduit into predetermined ratios forming center, inner annular, and outer annular flow streams which flow into the cavity and are recombined above the faceplate, the center flow stream exiting the baffle arrangement into the cavity after being deflected by the blocker plate and directed radially outward above a central portion of the faceplate, the inner annular flow stream exiting the baffle arrangement into the cavity above an inner annular region of the faceplate, and the outer annular flow stream exiting the baffle arrangement into the cavity above an outer annular region of the faceplate;
wherein the baffles provide different flow rates of the center, inner annular, and outer annular flow streams into the cavity at different radial locations such that a uniform concentration of the process gas is delivered through the faceplate.

12. The showerhead module of claim 11, wherein a backing plate forms the upper wall of the cavity and the baffle arrangement provides flow rates such that the center flow stream reaches an upper surface of the faceplate at the same time as the inner and outer annular flow streams.

13. The showerhead module of claim 11, wherein the baffle arrangement comprises a plurality of concentric baffles including an inner baffle, one or more intermediate baffles, and an outer baffle wherein each baffle divides process gas delivered into the gas delivery conduit into inner and outer flow streams such that the plurality of concentric baffles divide process gas flowing through the conduit into the center flow stream, at least two inner annular flow streams, and the outer annular flow stream, the center flow stream exiting the baffles and directed radially outward above the central portion of the faceplate, the inner annular flow streams exiting the baffles at different radial locations above the inner annular region of the faceplate, and the outer annular flow stream exiting the baffles above the outer annular region of the faceplate.

14. The showerhead module of claim 11, wherein the baffle arrangement comprises:
a first baffle which includes a vertically extending inner tube in the gas delivery conduit and a lower annular disc extending horizontally outward from a lower end of the inner tube in the cavity; and
a second baffle which includes a vertically extending outer tube in the gas delivery conduit and an upper annular disc extending horizontally outward from a lower end of the outer tube in the cavity wherein an outer diameter of the upper annular disc is greater than an outer diameter of the lower annular disc;

wherein the inner tube is in fluid communication with a first gap between the blocker plate and the lower annular disc, a second gap between the inner tube and the outer tube is in fluid communication with a third gap between the lower annular disc and the upper annular disc, and a fourth gap between the outer tube and a wall of the gas delivery conduit is in fluid communication with a fifth gap between the upper annular disc and an upper wall of the cavity.

15. The showerhead module of claim 14, wherein the outer diameter of the upper annular disc and the outer diameter of the lower annular disc are about 0.3 to 0.95 times an outer diameter of the faceplate.

16. The showerhead module of claim 14, wherein
(a) the upper annular disc and the lower annular disc are parallel to the faceplate; and/or
(b) the outer tube and the inner tube are coaxial with the gas delivery conduit.

17. The showerhead module of claim 14, wherein the gas delivery conduit forms a stem of the showerhead module and the cavity is disposed in a base of the showerhead module wherein the stem is connected to the base.

18. A method of forming the showerhead module of claim 14, comprising coaxially supporting the inner tube and the outer tube in the gas delivery conduit of the showerhead module.

19. The method of claim 18, and supporting the upper annular disc and the lower annular disc parallel to the faceplate.

20. The method of claim 18, further comprising:
(a) selecting the diameter of the inner tube, and dimensions of the first, second, third, fourth, and fifth gap such that the concentration uniformity of process gas delivered to an upper surface of a substrate configured to be supported below the faceplate has less than a 12% variation across the upper surface; or
(b) selecting the diameter of the inner tube, and dimensions of the first, second, third, fourth, and fifth gap such that the concentration uniformity of process gas delivered to an upper surface of a substrate configured to be supported below the faceplate has less than an 8% variation across the upper surface.

* * * * *